(12) United States Patent
Muthukrishnan et al.

(10) Patent No.: US 9,728,532 B2
(45) Date of Patent: Aug. 8, 2017

(54) CLAMP BASED ESD PROTECTION CIRCUITS

(75) Inventors: Swaminathan Muthukrishnan, Greensboro, NC (US); Nathaniel Peachey, Oak Ridge, NC (US); Cody Hale, Browns Summit, NC (US); Ralph Williamson, Winston-Salem, NC (US)

(73) Assignee: Qorvo US, Inc., Greensboro, NC (US)

( * ) Notice: Subject to any disclaimer, the term of this patent is extended or adjusted under 35 U.S.C. 154(b) by 1065 days.

(21) Appl. No.: 13/446,697

(22) Filed: Apr. 13, 2012

(65) Prior Publication Data

US 2012/0262828 A1 Oct. 18, 2012

Related U.S. Application Data

(60) Provisional application No. 61/474,930, filed on Apr. 13, 2011.

(51) Int. Cl.
*H02H 9/00* (2006.01)
*H01L 27/02* (2006.01)
*H02H 9/04* (2006.01)

(52) U.S. Cl.
CPC ......... *H01L 27/0274* (2013.01); *H02H 9/046* (2013.01)

(58) Field of Classification Search
USPC ........................................................ 361/56
See application file for complete search history.

(56) References Cited

U.S. PATENT DOCUMENTS

| 4,540,893 | A | * | 9/1985 | Bloomer | H03K 17/04126 327/170 |
| 4,649,302 | A | * | 3/1987 | Damiano | H03K 17/6874 323/351 |
| 4,888,504 | A | * | 12/1989 | Kinzer | H03K 17/785 257/328 |
| 6,946,891 | B2 | * | 9/2005 | Asano | B82Y 30/00 327/318 |
| 7,102,862 | B1 | * | 9/2006 | Lien | H01L 27/0285 361/56 |
| 7,199,635 | B2 | * | 4/2007 | Nakatsuka | H03K 17/102 327/308 |
| 7,328,041 | B2 | | 2/2008 | Tasaka | |
| 7,881,030 | B1 | * | 2/2011 | Li et al. | ......... 361/56 |
| 2001/0015437 | A1 | | 8/2001 | Ishii et al. | |

(Continued)

FOREIGN PATENT DOCUMENTS

JP 2009232137 A 10/2009

OTHER PUBLICATIONS

Non-Final Office Action for U.S. Appl. No. 13/849,834, mailed Oct. 6, 2014, 17 pages.

(Continued)

*Primary Examiner* — Ronald W Leja
(74) *Attorney, Agent, or Firm* — Withrow & Terranova, P.L.L.C.

(57) ABSTRACT

An electro-static discharge (ESD) protection circuit utilizes a gate-drain breakdown characteristic of high electron mobility transistors (HEMTs) in a dual stacked configuration to provide a discharge path for electro-static discharges, while having a minimal effect on the associated circuit which is being protected.

8 Claims, 15 Drawing Sheets

DRAIN-GATE BREAKDOWN CURRENT

(56) References Cited

U.S. PATENT DOCUMENTS

| | | | | |
|---|---|---|---|---|
| 2001/0040479 | A1* | 11/2001 | Zhang | H03K 17/687 327/427 |
| 2005/0275031 | A1* | 12/2005 | Dournelle | H01L 27/0266 257/355 |
| 2005/0285143 | A1* | 12/2005 | Asano | H01L 27/0629 257/192 |
| 2007/0049352 | A1 | 3/2007 | Nakajima et al. | |
| 2008/0218927 | A1 | 9/2008 | Harada et al. | |
| 2009/0086394 | A1* | 4/2009 | Yasuda | H02H 9/046 361/56 |
| 2010/0001347 | A1* | 1/2010 | Sugiura | 257/350 |
| 2011/0092246 | A1 | 4/2011 | Ginsburg et al. | |
| 2012/0040632 | A1 | 2/2012 | Mikhemar et al. | |
| 2012/0262828 | A1* | 10/2012 | Muthukrishnan | H02H 9/046 361/56 |
| 2013/0215808 | A1* | 8/2013 | Muthukrishnan | H02H 9/045 370/297 |
| 2014/0327048 | A1* | 11/2014 | Chow | H01L 27/0248 257/195 |

OTHER PUBLICATIONS

Muthukrishnan, S. et al., "A novel on-chip protection circuits for RFICs implemented in D-mode pHEMT technology," 29th Electrical Overstress/Electrostatic Discharge Symposium, Sep. 16-21, 2007, pp. 4A.3-1-4A.3-7.

Kohama, K. et al., "An antenna switch MMIC for GSM/UMTS handsets using E/D-mode JPHEMT technology," Radio Frequency Integrated Circuits (RFIC) Symposium, Jun. 12-14, 2005, pp. 509-512.

Chen, Yuh-Yue et al., "ESD Considerations for SOI Switch Design," IEEE International SOI Conference, Oct. 2011, 2 pages.

Muthukrishnan, Swaminathan et al., "A Novel Clamp Based ESD Protection Strutcture for High Power RF Ports in GaAs pHEMT Process," IEEE Compound Semiconductor IC Symposium Digest, Oct. 2011, pp. 83-86.

Advisory Action for U.S. Appl. No. 13/849,834, mailed Dec. 3, 2015, 3 pages.

Final Office Action for U.S. Appl. No. 13/849,834, mailed Jul. 20, 2015, 19 pages.

Non-Final Office Action for U.S. Appl. No. 13/849,834, mailed Jan. 21, 2016, 18 pages.

Final Office Action for U.S. Appl. No. 13/849,834, mailed Aug. 26, 2016, 17 pages.

Notice of Allowance for U.S. Appl. No. 13/849,834, mailed Dec. 15, 2016, 5 pages.

* cited by examiner

DUAL CLAMP SCHEMATIC

DRAIN-GATE BREAKDOWN CURRENT

ESD CURRENT FLOW

DUAL CLAMP LAYOUT (158μmX65μm)

WORKING OF THE DUAL CLAMP
DURING A POSITIVE ESD EVENT

WORKING OF THE DUAL CLAMP
DURING A NEGATIVE ESD EVENT

POSITIVE TLP IV AND LEAKAGE CURVES

NEGATIVE TLP IV AND LEAKAGE CURVES

CAPACITANCE OF THE UNBIASED DUAL CLAMP

INSERTION LOSS OF STANDALONE DUAL
CLAMP UNDER CW POWER SWEEP

MEASURED LARGE SIGNAL INSERTION LOSS BETWEEN
TX-ANT ON RF5611 WITH DUAL CLAMP (INSERTION GAIN)

EVM ON RF5611 WITH/WITHOUT DUAL CLAMP
(25'C, 3.6V and 2.5 GHz)

2ND & 3RD HARMONICS ON RF5611 WITH/WITHOUT DUAL CLAMP
(25°C, 3.6V and 2.5 GHz)

CLAMP BASED ESD PROTECTION CIRCUITS

RELATED APPLICATIONS

This application claims the benefit of U.S. provisional patent application No. 61/474,930, filed Apr. 13, 1011, the disclosure of which is incorporated herein by reference in its entirety.

FIELD OF THE DISCLOSURE

This disclosure is in the field of electro-static discharge (ESD) protection circuits utilizing a gate-drain breakdown characteristic of high electron mobility transistors (HEMTs) in a stacked configuration.

BACKGROUND

Electro-static discharge protection is a critical factor in circuit design. Therefore, it is critical to provide a discharge path for such discharge events, in order to protect the remainder of the electronic device.

Electro-static discharge (ESD) is a major reliability issue in integrated circuits (ICs). Due to the complexities in RF-ESD co-design, the ESD rating for RF circuits has been traditionally low. Hence there is a growing demand for improvement in the ESD robustness of RF circuits.

The standard ESD circuit is merely a diode. ESD circuits may also be comprised of alternative techniques such as thick field oxide (TFO) clamps, Silicon controlled rectifiers (SCRs), grounded gate NMOS (GGNMOS), spark gaps, or transistors.

Gallium-Arsenide (GaAs) has historically been the preferred technology for Power Amplifiers (PA), Low Noise Amplifiers (LNA) and switches because of its intrinsically higher electron mobility, low base resistance, low-loss semi-insulating substrate, linearity, higher transition frequency and breakdown voltage.

ESD protection of RF circuits designed in GaAs HBT (Heterojunction Bipolar Transistor) and pHEMT (pseudomophic HEMT) technologies is still in its infancy and is the topic of significant research and development. Some novel ESD protection schemes for RF circuits use GaAs processes; however they are not suitable for high power RF ports.

A high electron mobility transistor (HEMT), heterostructure FET (HFET), or modulation-doped FET (MODFET), is a field effect transistor incorporating a junction between two materials with different band gaps (i.e., a heterojunction) as the channel instead of a doped region, as is generally the case for MOSFET. A commonly used material combination is GaAs with AlGaAs, though there is wide variation, dependent on the application of the device. Devices incorporating more Indium generally show better high-frequency performance, while in recent years, gallium nitride HEMTs have attracted attention due to their high-power performance.

To allow conduction, semiconductors are doped with impurities which donate mobile electrons (or holes). However, these electrons are slowed down through collisions with the impurities (dopants) used to generate them in the first place. HEMTs avoid this through the use of high mobility electrons generated using the heterojunction of a highly-doped wide-bandgap n-type donor-supply layer (AlGaAs in our example) and a non-doped narrow-bandgap channel layer with no dopant impurities (GaAs in this case).

The electrons generated in the thin n-type AlGaAs layer drop completely into the GaAs layer to form a depleted AlGaAs layer, because the heterojunction created by different band-gap materials forms a quantum well (a steep canyon) in the conduction band on the GaAs side where the electrons can move quickly without colliding with any impurities because the GaAs layer is undoped, and from which they cannot escape. The effect of this is to create a very thin layer of highly mobile conducting electrons with very high concentration, giving the channel very low resistivity (or to put it another way, "high electron mobility"). This layer is called a two-dimensional electron gas. As with all the other types of FETs, a voltage applied to the gate alters the conductivity of this layer.

Ideally, the two different materials used for a heterojunction would have the same lattice constant (spacing between the atoms). In practice, e.g. AlGaAs on GaAs, the lattice constants are typically slightly different, resulting in crystal defects. As an analogy, imagine pushing together two plastic combs with a slightly different spacing. At regular intervals, you'll see two teeth clump together. In semiconductors, these discontinuities form deep-level traps, and greatly reduce device performance. A HEMT where this rule is violated is called a pHEMT or pseudomorphic HEMT. This is achieved by using an extremely thin layer of one of the materials—so thin that the crystal lattice simply stretches to fit the other material. This technique allows the construction of transistors with larger bandgap differences than otherwise possible, giving them better performance.

Another way to use materials of different lattice constants is to place a buffer layer between them. This is done in the mHEMT or metamorphic HEMT, an advancement of the pHEMT. The buffer layer is made of AlInAs, with the Indium concentration graded so that it can match the lattice constant of both the GaAs substrate and the GaInAs channel. This brings the advantage that practically any Indium concentration in the channel can be realized, so the devices can be optimized for different applications (low indium concentration provides low noise; high indium concentration gives high gain).

The tradeoff for this high performance is a low voltage rating at which catastrophic failure occurs, such as the voltages generated by an electro-static discharge event. Thus, the challenge is to design an electro-static discharge protection circuit structure using HEMTs that can be integrated onto the die.

SUMMARY

The present disclosure relates to a circuit structure for protecting RF (radio-frequency) ports designed to handle high (>30 dBm) power levels in one embodiment. The circuit structure ("Dual Clamp" or "Dual E-Clamp," or "high trigger clamp") includes two high electron mobility transistors (HEMTs), each having a resistor connected between gate and source, and the transistors being connected in a back-to-back configuration (the source of the first transistor being connected to the source of the second transistor). These HEMTs are enhancement mode (E-mode) FETs.

Since the structure includes two FETs connected in a back-to-back configuration, the effective loading capacitance of the structure is half of the loading capacitance of a single OFF FET. In one embodiment, the structure has a relatively high ±21V trigger voltage (+21V for positive ESD events, and −21V for negative ESD events). The low effective loading capacitance along with the high trigger voltage makes this design well suited for protecting high power RF ports.

The present disclosure improves the ESD rating of medium/high power products (especially switches). With the help of this high trigger clamp, an improved ESD (Electrostatic Discharge) rating is obtained with a marginal increase in die size and a minimal effect on performance.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1A:
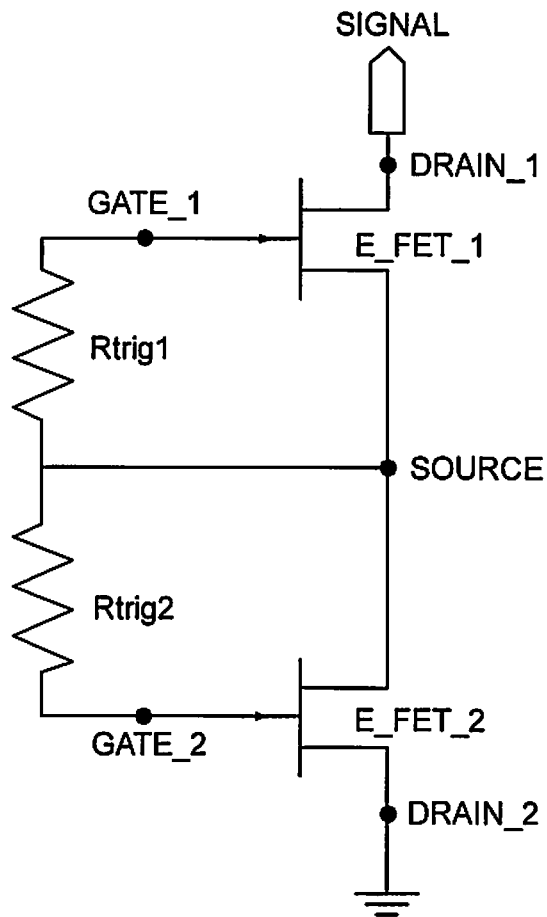
FIG. 1A is an illustrative dual clamp schematic.

FIG. 1A is an illustrative dual clamp schematic of one embodiment of the present disclosure. The structure (Dual E-clamp) includes two pHEMT clamps connected in back to back configuration. Each clamp consists of an E-mode Field Effect Transistor (E_FET) with a resistor ($R_{trig}$) connected between gate and source.

Specifically, the first transistor E_FET_1 is defined by three nodes: DRAIN_1, GATE_1, and SOURCE. The second transistor E_FET_2 is defined by three nodes: DRAIN_2, GATE_2, and SOURCE. Note that SOURCE is a common node which serves as the source for the first transistor and as the source for the second transistor in a two FET back-to-back configuration.

Regarding the first transistor, DRAIN_1 serves as an input node for an RF port labeled SIGNAL. The DRAIN_1 node is connected to the RF port labeled SIGNAL that needs to be ESD protected. A first trigger resistor Rtrig1 connects GATE_1 to SOURCE. The node SOURCE is a common source connecting the source of the first transistor to the source of the second transistor.

Regarding the second transistor, DRAIN_2 is connected to ground. Additional transistors may be placed in series with the first and second transistor (see FIGS. 8A and 8D). A second trigger resistor Rtrig2 connects GATE_2 to SOURCE. Again, the node SOURCE is a common source connecting the source of the first transistor to the source of the second transistor.

During normal operation (no ESD events), the clamp is OFF, and no current (except a very small leakage current) flows through the clamp. An RF processing circuit associated with the clamp (and connected to the SIGNAL input) operates normally, with only a slight effect from the small leakage current and from the capacitance of the clamp. For example, the associated circuit may be a switch or may be a power amplifier. The working principles during positive and negative ESD events are depicted in the following figures.

Figure 1B:
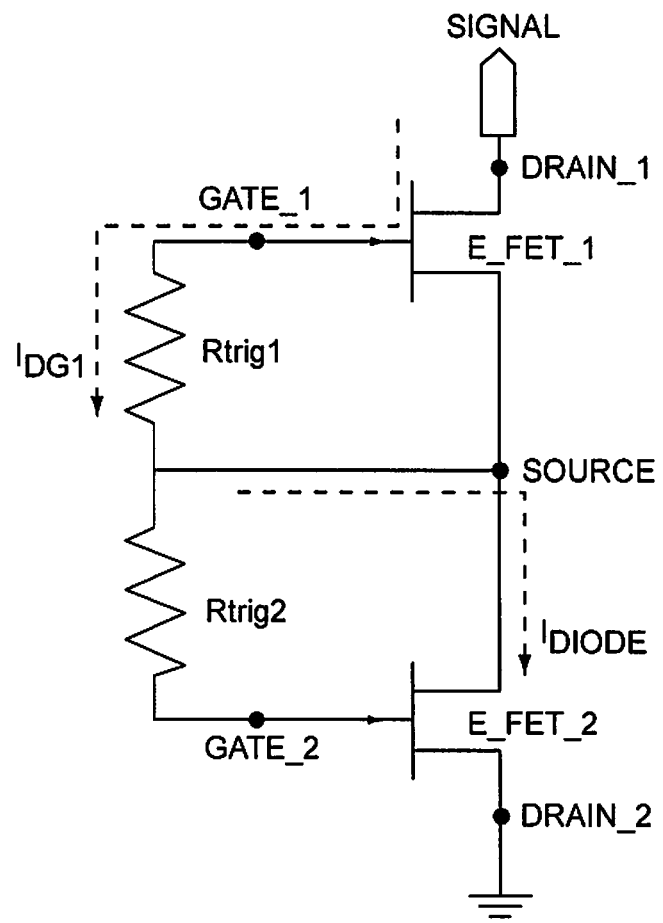
FIG. 1B illustrates a drain-gate breakdown current.

FIG. 1B illustrates a drain-gate breakdown current $I_{DG1}$. During a positive ESD event, as the SIGNAL voltage approaches (or exceeds) the drain-gate breakdown voltage (BVdgo1) of the first transistor, the leakage through the drain-gate junction of the first transistor increases, and a drain-gate breakdown current $I_{DG1}$ flows from DRAIN_1 to GATE_1, and then flows through resistor Rtrig1. As the voltage $V_{GS1}$ from GATE_1 to SOURCE increases beyond the threshold voltage Vth1 of the first transistor, the first transistor acts as a clamp.

In addition to triggering the clamp, the value of Rtrig1 needs to be large enough to prevent thermal runaway once the gate-drain junction of the first transistor breaks down.

A small portion of this drain-gate breakdown current $I_{DG1}$ flows through resistor Rtrig2 to GATE_2 to turn on the second transistor (which acts as a diode with a turn on voltage of Vth2), and the remainder (the majority) of this (ESD)current $I_{DG1}$ flows through the SOURCE and through the second transistor (which acts as a shunt) as $I_{DIODE}$.

Figure 1C:
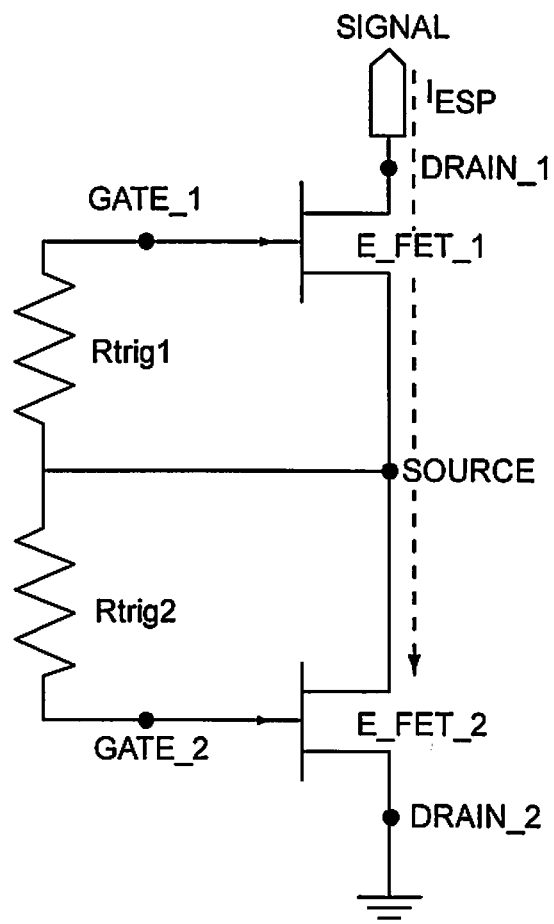
FIG. 1C illustrates an ESD (Electro-Static Discharge) current flow.

FIG. 1C illustrates an ESD current flow. The dual clamp device is triggered by a trigger voltage at the RF SIGNAL input of Vtrig=BVdgo1+Vth2. Preferably, the transistors are identical, and would have the same threshold voltage (Vth1=Vth2).

During a negative ESD event, the functionalities of the two transistors reverse.

Figure 1D:
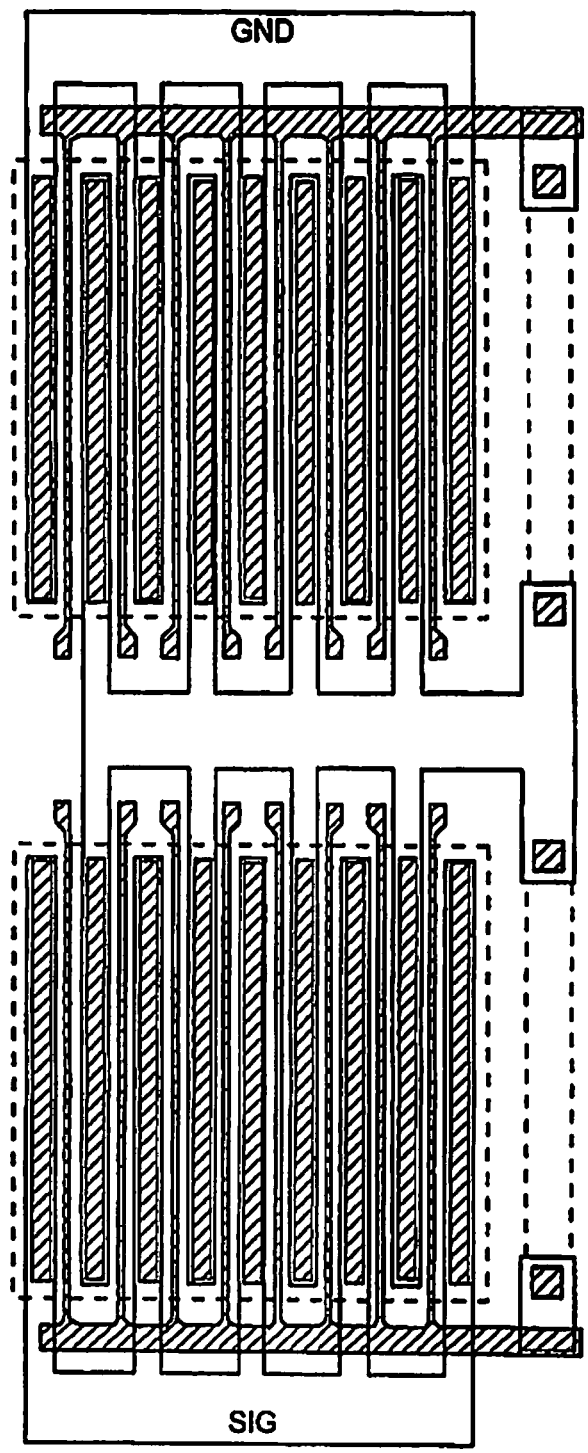
FIG. 1D is an illustrative dual clamp layout.

FIG. 1D is an illustrative dual clamp layout. An 8 finger, 50 μm gate width and 0.5 μm gate length device with A 1000Ω resistor ($R_{trig}$) was chosen to meet a 1000V Human Body Model (HBM) ESD requirement. These values are dependent upon the process and could be varied based on the ESD requirement and process parameters.

Figure 2A:
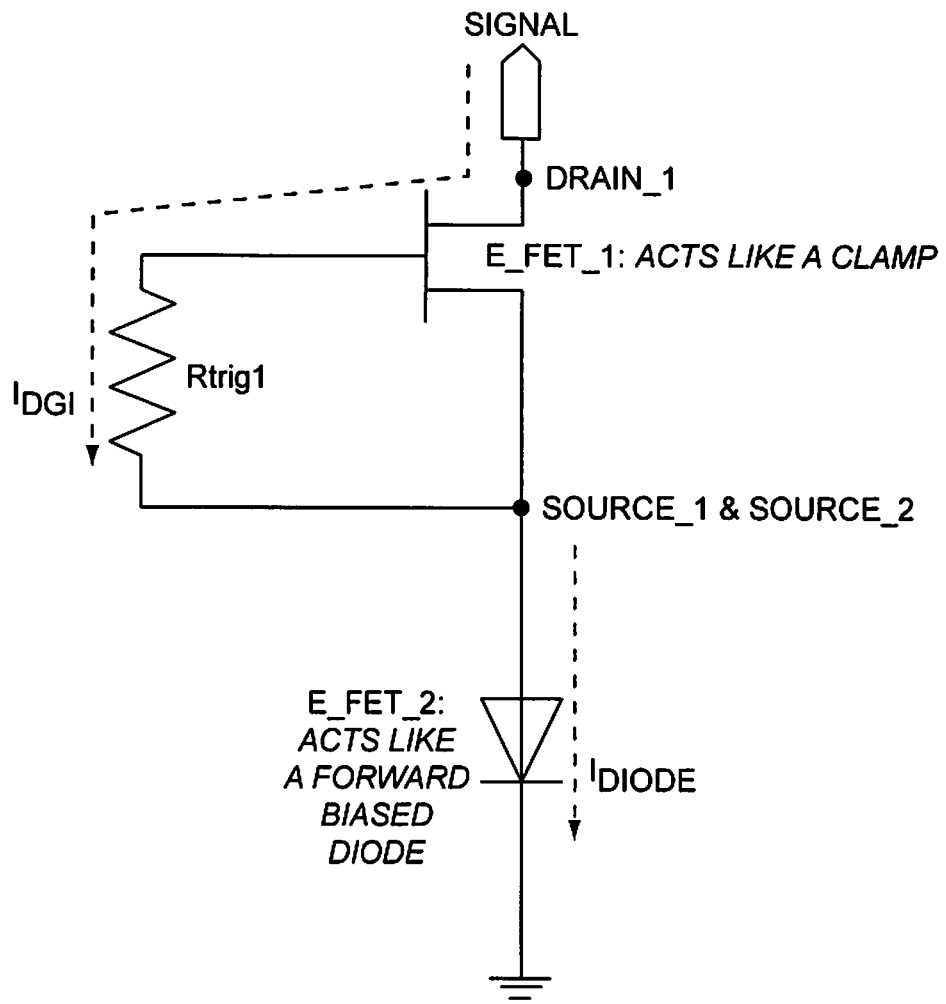
FIG. 2A is an illustrative dual clamp during a positive ESD event.

FIG. 2A is an illustrative dual clamp during a positive ESD event, and is similar to FIG. 1B, but more clearly illustrates that the first transistor acts as a clamp and the second transistor acts as a forward based diode.

Figure 2B:
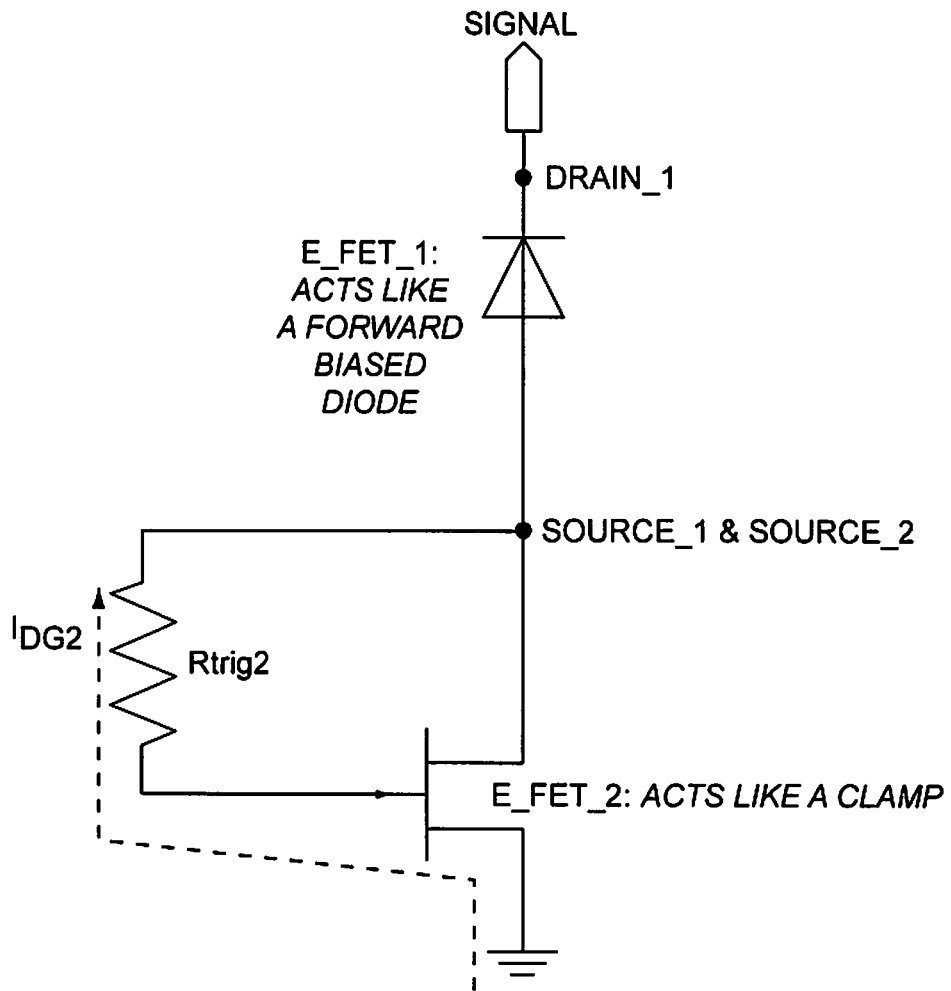
FIG. 2B is an illustrative dual clamp during a negative ESD event.

FIG. 2B is an illustrative dual clamp during a negative ESD event, and is similar to FIG. 2A except operating in reverse.

Figure 3A:
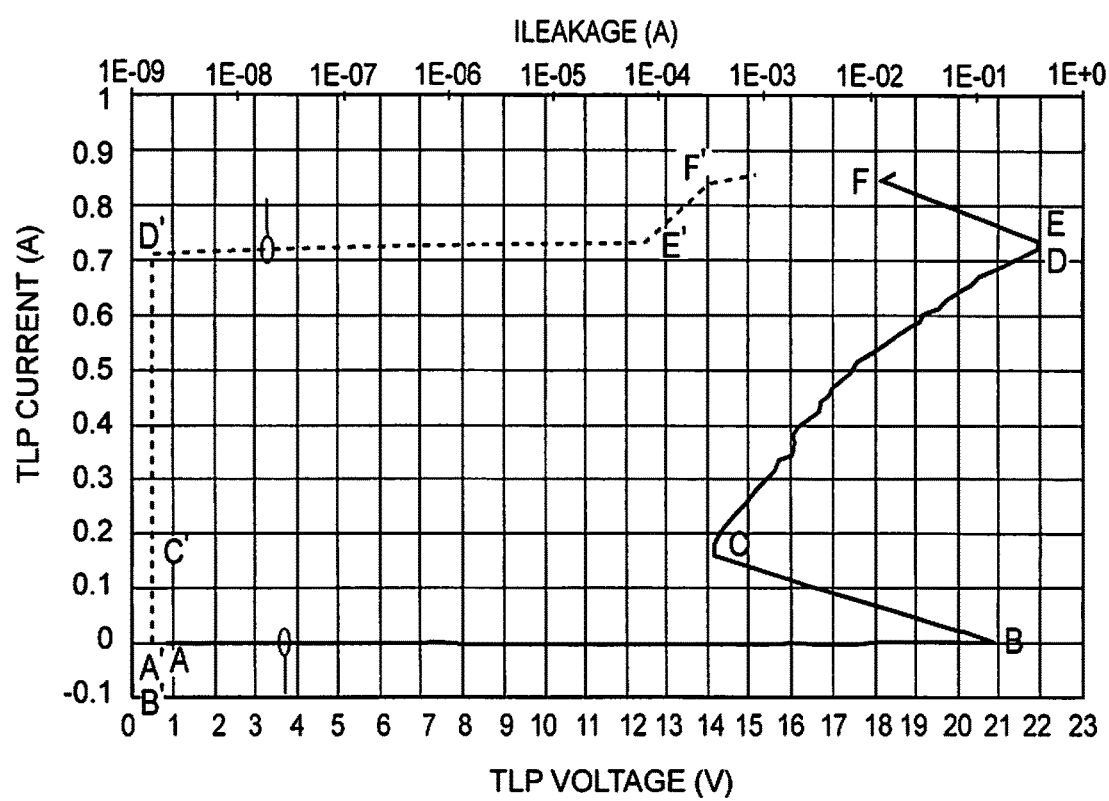
FIG. 3A illustrates positive TLP IV and leakage curves.

FIG. 3A illustrates positive TLP IV and leakage curves. A transmission line pulser (TLP) is a universally accepted ESD characterization tool which can monitor the voltage and current at the device under test (DUT) during an ESD event.

A 10 ns rise-time, 100 ns pulse width square pulse was generated using the pulser. The above mentioned pulse width and rise time was chosen to mimic a Human Body Model (HBM) type ESD event.

Specifically, transmission line pulsing (TLP) test results from a stand-alone clamp structure (not connected to any RF processing circuit) are shown in FIG. 3A. The solid line indicates TLP current versus TLP voltage (bottom axis). The dashed line indicates TLP current versus leakage current (ILeakage). The dashed line is a constant current that is measured after every single pulse point to make sure that the structure is not destroyed.

Points A through E on the solid line correspond to points A' through E' on the dashed line, respectively.

Regarding the solid line, from A to B the TLP voltage (signal voltage or voltage at DRAIN_1) is increased from 1V to 21V (plotted in bottom X axis) and the corresponding TLP current is measured (plotted in Y-axis). Region A to B of the solid line (TLP curve) shows that as the voltage increases from 1V to 21V, the TLP current is close to 0 Amps (negligible) indicating that the structure is OFF. This denotes that any RF signal which has a voltage level less than 21V will NOT trigger the ESD structure. After every voltage step, a leakage test is performed on the ESD structure to determine if the structure is functional. This is shown by the dashed line A'-B'. The leakage current is plotted in top X-axis vs TLP current in Y-axis. Since TLP current did not change (almost 0 Amp) in region A-B, region A'-B' corresponds to single point, and the leakage current is 1E−9 Amp. At point B on the solid line, the clamp is triggered at about 21V.

Points B to C in the solid line correspond to "snap-back region" points B' to C' in the dashed line. When the TLP voltage exceeds 21V, the structure turns ON, snaps back and clamps the voltage to 14V (point C). After every single test point between B and C, a leakage test is performed and is shown in B'-C' region of the dotted line. The leakage current doesn't change (remains around 1E−9) indicating the device or structure is still functional.

Points C to D in the solid line correspond to points C' to D' in the dashed line. Once the device turns ON, as the test voltage is increased, the TLP current increases and there is a marginal increase in TLP voltage until the device's maximum current handling capability (which depends on the size of the device) is reached.

Points D to E in the solid line correspond to points D' to E' in the dashed line. Failure of the clamp occurs at points E and E'. For this particular device size, region D corresponds the maximum current handling of the structure and hence signifies the TLP current handling of this particular structure. This structure was specifically designed to meet 1000V HBM ESD rating. The TLP current rating required to meet 1000V HBM rating is approximately 0.67 A. The size of the FETs can be increased/decreased to change the TLP current handling (and the ESD rating) of the structure.

Figure 3B:
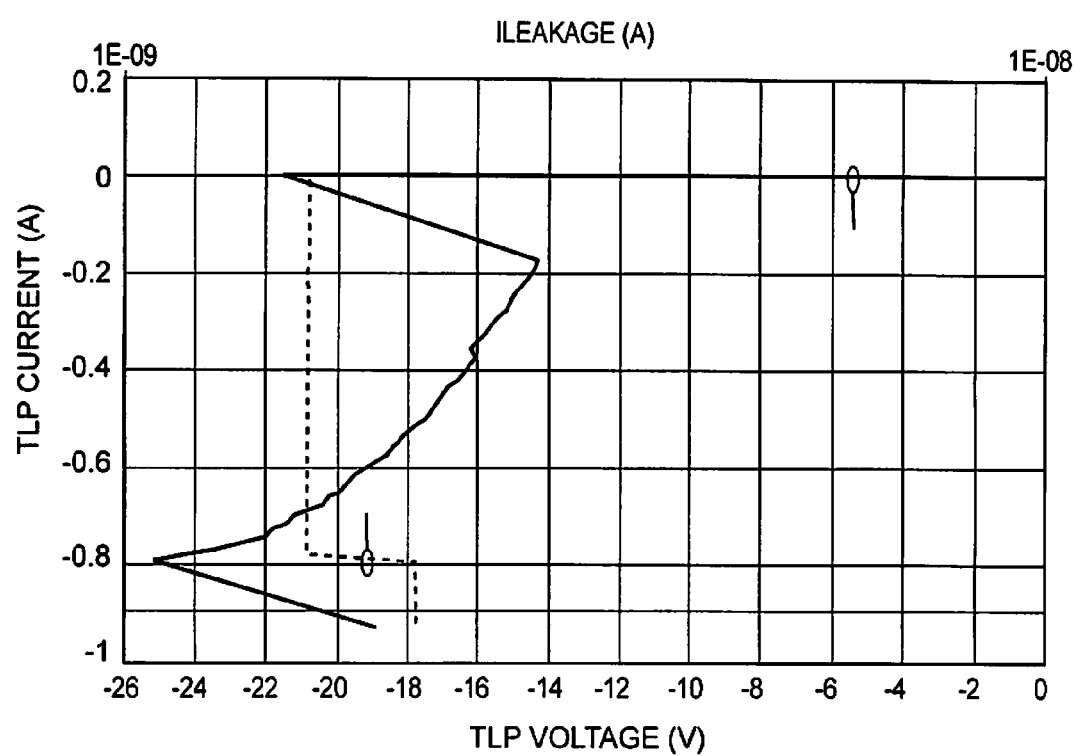
FIG. 3B illustrates negative TLP IV and leakage curves.

As expected, the pulsed IV curves are similar for positive and negative ESD events (see FIG. 3B in comparison to FIG. 3A). Leakage measurements were performed at a constant DC voltage after every single TLP pulse voltage. Any shift in the DC leakage current is considered as a device failure. The TLP current level at which the failure occurs determines the TLP current handling of the clamp. The structure has a trigger voltage of ±21V and can handle ±0.7 A of TLP current. The measured HBM rating of this structure is 1400V. As mentioned earlier, the trigger voltage is process dependent and the size of the FETs could be varied to obtain the desired ESD protection level.

FIG. 3B illustrates negative TLP IV and leakage curves. FIG. 3B is similar to FIG. 3A, but for a negative ESD event.

Loading capacitance is a very important parameter defining an ESD structure. Since the proposed structure has two clamps in series, the effective capacitance of the ESD structure is half of the capacitance of each clamp.

The channel is OFF during normal operation and hence the drain-source capacitance ($C_{ds}$) for each clamp is low. For each clamp, the gate-source ($C_{gs}$) and gate-drain ($C_{gd}$) fringing capacitance are in series which reduces the overall capacitance for each clamp. The above capacitances ($C_{ds}$, $C_{gs}$, and $C_{gd}$) are capacitances for a single transistor or clamp.

Figure 4:
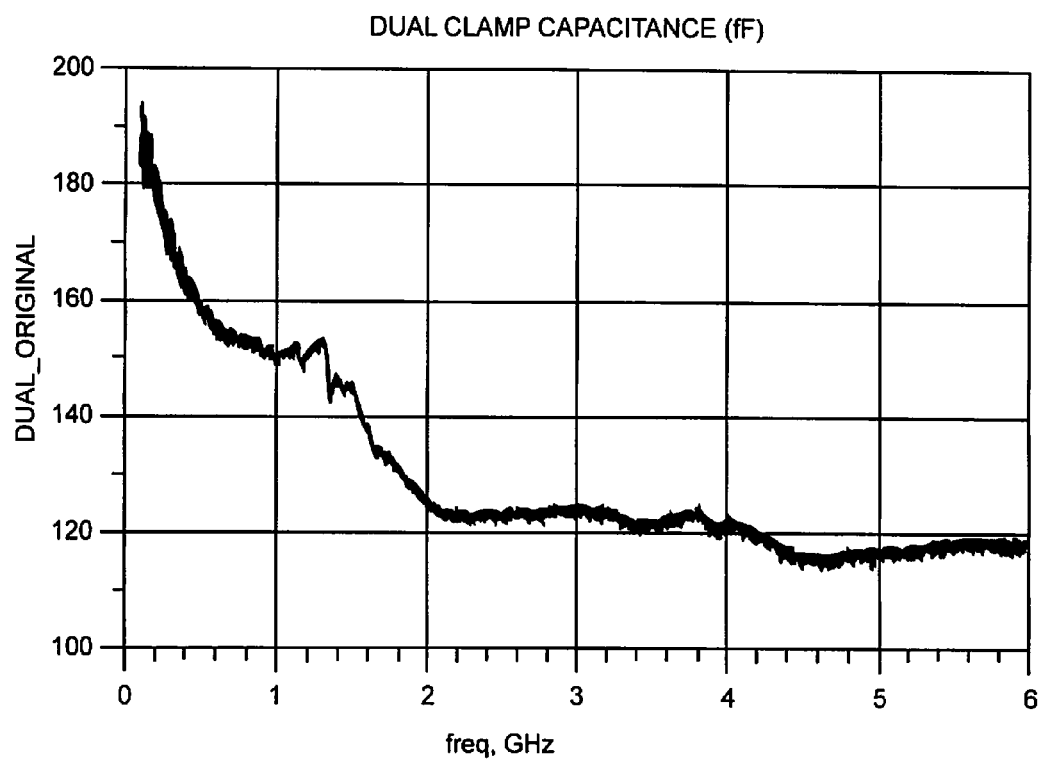
FIG. 4 illustrates the capacitance of an unbiased dual clamp as a function of frequency.

FIG. 4 illustrates the capacitance of an unbiased dual clamp as a function of frequency. There is generally a reduction in the capacitance at higher frequencies, but for frequencies beyond 2 GHz the capacitance of the dual clamp is fairly constant (around 120 fF). This constancy is an important property because non-linearities in system performance are caused mainly due to the change in capacitance over frequency. Thus, this illustrative dual clamp provides relatively constant capacitance from 2 GHz to 6 GHz. The inventors use the term "dual clamp" to describe this structure, because one of the transistors functions as a clamp for a positive ESD event, and the other transistor functions as a clamp during a negative ESD event.

Figure 5:
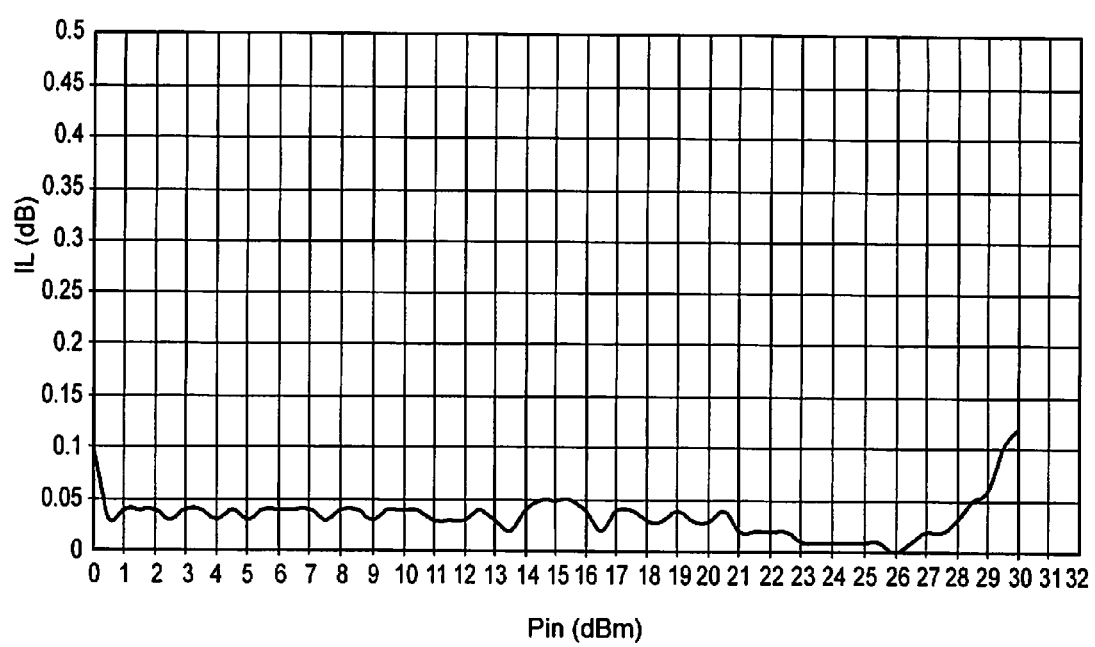
FIG. 5 illustrates the insertion loss as a function of power.

FIG. 5 illustrates the insertion loss as a function of power. Specifically, FIG. 5 shows the insertion loss as a function of power of the standalone dual clamp measured at matched (50Ω) conditions. FIG. 5 does not show the compression point because the test setup could not (at that time) apply an RF signal >30 dBm. As the power level increases, the voltage swing increases. Once the voltage swing exceeds the trigger voltage of the clamp, the clamp would turn ON and start clipping the RF signal. The structure was added to Pout node of a product (RF5611), and therefore the power was labeled Pout (although it is actualy Pin relative to the structure). FIG. 5 indicates that the standalone clamp does not turn ON up to 30 dBm during a continuous wave (CW) power sweep.

For a Front End Module (Low Noise Amplifier with a SP3T switch), the maximum power rating of the WLAN Transmit (TX) port of the switch is 30 dBm.

Figure 6:
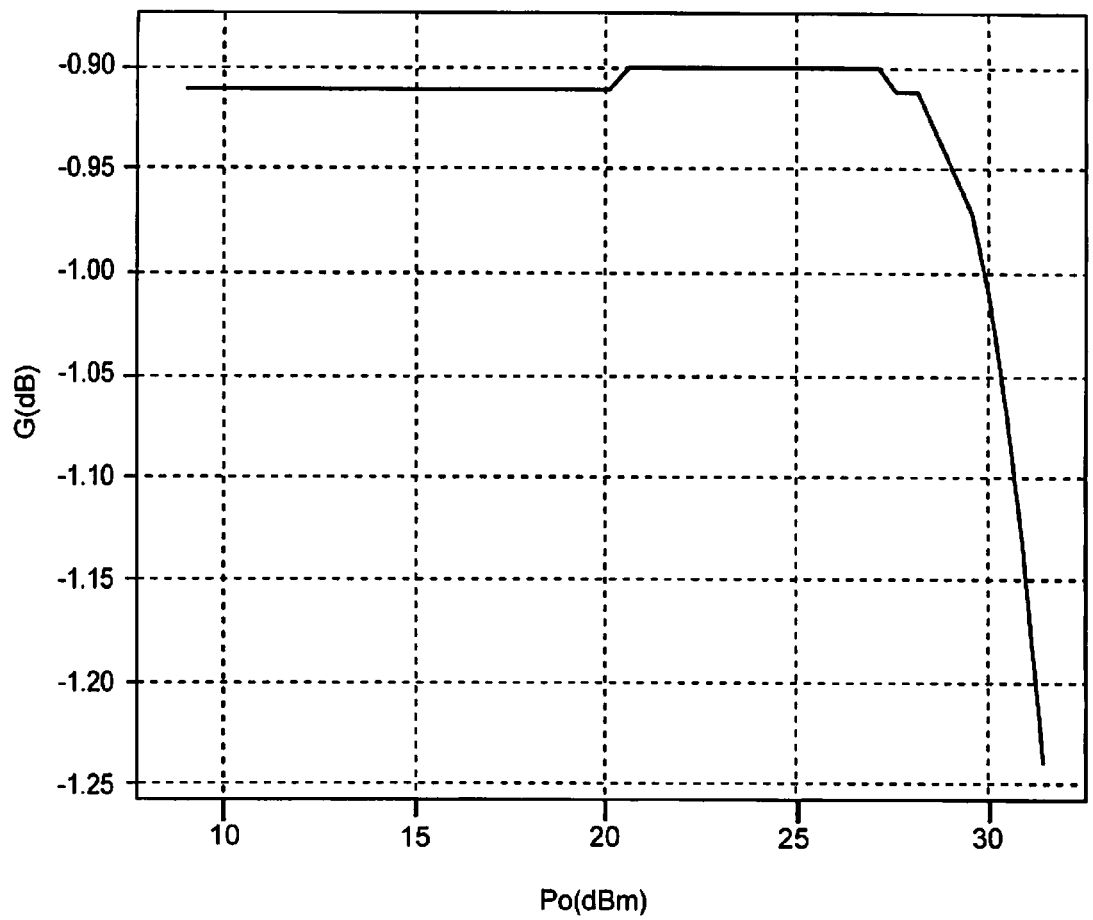
FIG. 6 illustrates the insertion gain as a function of power.

FIG. 6 illustrates the insertion gain as a function of power. Specifically, FIG. 6 shows the large signal insertion loss from the TX to Antenna (ANT) port. Power sweep data shows that the clamp does not compress even at 30 dBm. This baseline die was laid out without ESD protection and compared with another die where the ESD clamp structure was added to the TX port. Insertion loss is a positive number. For example, 0.9 dB insertion loss means the signal is degraded by 0.9 dB.

Figure 7A:
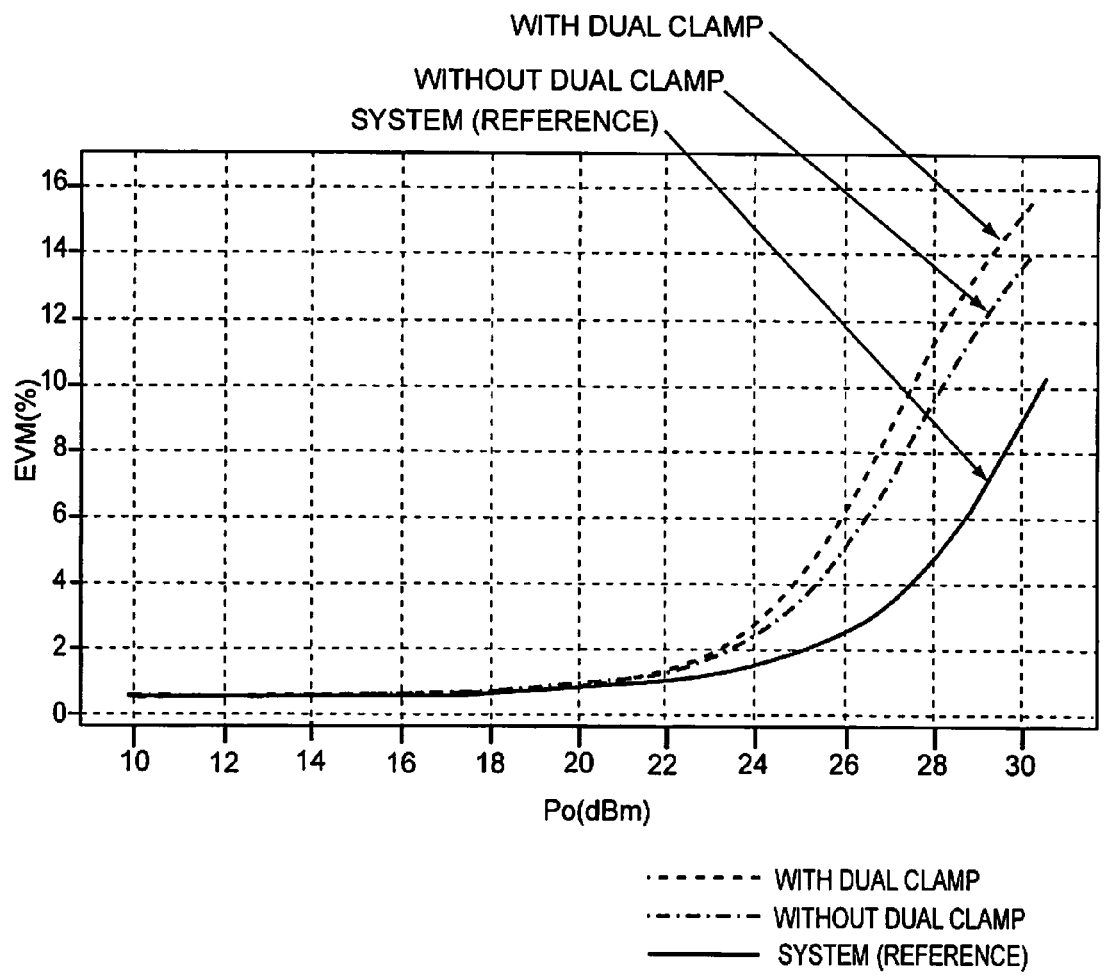
FIG. 7A illustrates EVM (Error Vector Magnitude) as a function of power.

FIG. 7A illustrates a linearity metric EVM (Error Vector Magnitude) as a function of power. The clamp has marginal impact on the EVM linearity metric.

Figure 7B:
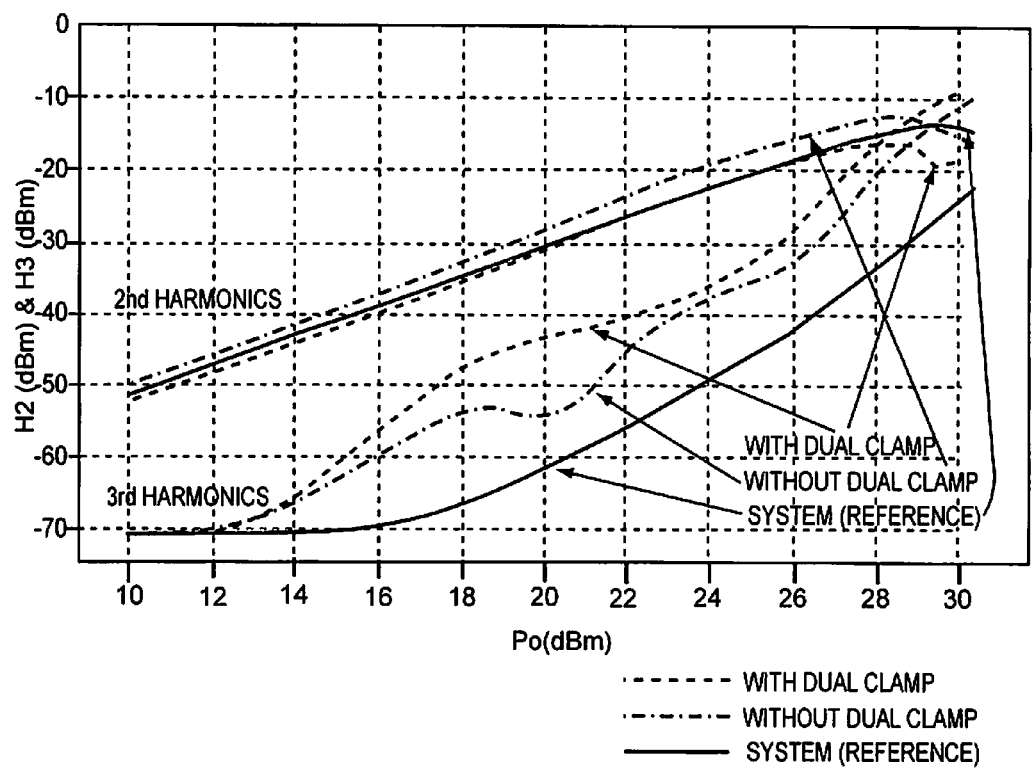
FIG. 7B illustrates second and third harmonics as a function of power.

FIG. 7B illustrates second and third harmonics as a function of power, with and without the dual clamp. The dual clamp has marginal impact on the linearity metrics of second and third harmonics.

Figure 8A:
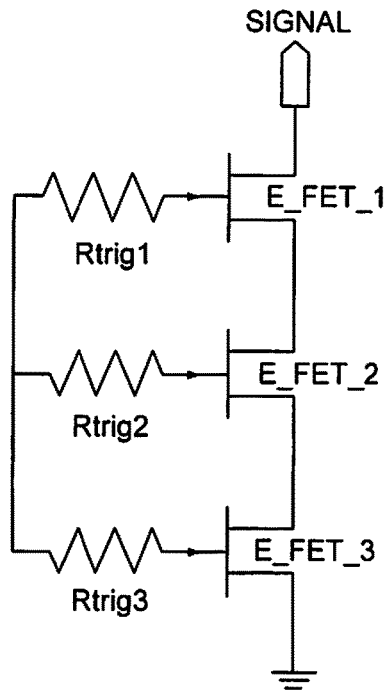
FIGS. 8A through 8D illustrate various embodiments of the present disclosure.

FIG. 8A though 8D illustrate various embodiments of the present disclosure. In FIG. 8A, multiple clamps are added in series to increase the effective trigger voltage. This increases the maximum power handling of the clamp.

Figure 8B:
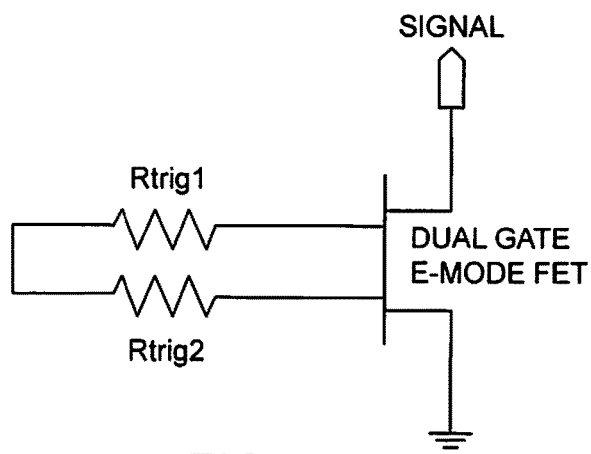
Figure 8C:
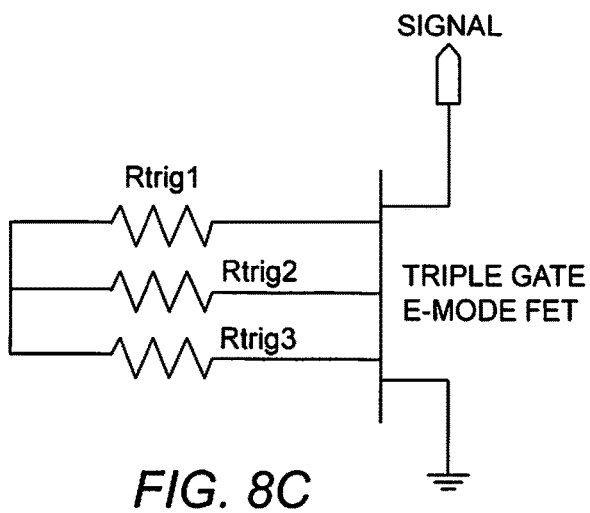
Figure 8D:
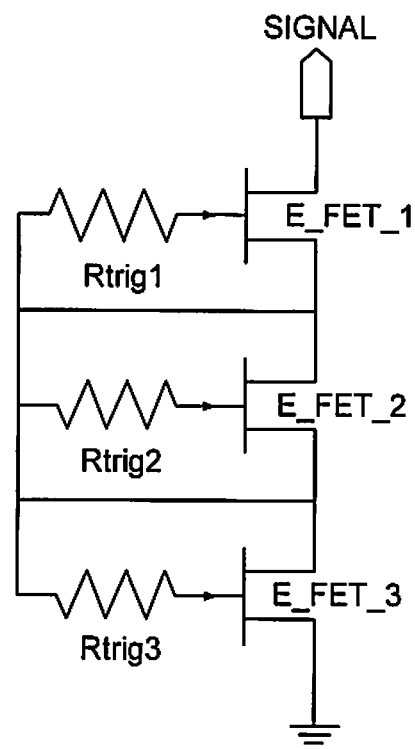

In FIG. 8B, a dual gate FET is used. In FIG. 8C, a triple gate FET is used. Multiple gate FETs may be more area efficient when compared with series connected back to back single clamps. In FIG. 8D, multiple claims are added in series to increase the effective trigger voltage. All such variations are considered within the scope of the present disclosure.

Those skilled in the art will recognize improvements and modifications to the embodiments of the present disclosure. All such improvements and modifications are considered within the scope of the concepts disclosed herein and the claims that follow.

What is claimed is:

1. An ESD (Electro-static Discharge) protection circuit comprising:
   an input node;
   a first resistor;
   a second resistor;
   a first transistor comprising a first drain contact connected to the input node, a first gate contact, and a first source contact connected to the first gate contact via the first resistor; and
   a second transistor comprising a second source contact connected to the first source contact, a second gate contact connected to the second source contact via the second resistor, and a second drain contact in electrical communication with a ground, wherein the occurrence of an ESD event at the input node causes a junction in the first transistor between the first drain contact and the first gate contact to break down such that current flows through the first transistor from the first drain contact to the first gate contact.

2. The ESD protection circuit of claim 1, wherein the ESD protection circuit is configured to turn ON when a voltage at the input node is equal to or greater than a positive trigger voltage, and is configured to turn ON when the voltage at the input node is less than or equal to a negative trigger voltage.

3. The ESD protection circuit of claim 2, wherein the first transistor and the second transistor are pHEMTs (pseudomorphic high electron mobility transistors).

4. The ESD protection circuit of claim 3, wherein the first transistor and second transistor are enhanced mode transistors.

5. The ESD protection circuit of claim 4, wherein the first transistor and the second transistor are configured to provide the positive trigger voltage based on the following equation: positive trigger voltage equals a drain-gate breakdown voltage of the first transistor plus a threshold voltage of the first transistor.

6. The ESD protection circuit of claim 5, wherein the second transistor is substantially identical to the first transistor, and the positive trigger voltage is equal and opposite to the negative trigger voltage.

7. The ESD protection circuit of claim 1, further comprising a third transistor and a third resistor,
   wherein the third transistor includes a third source contact, a third gate contact, and a third drain contact,
   wherein the third transistor is configured such that the third source contact is connected to the second drain contact, the third gate contact is connected to a third gate end of the third resistor, and the third drain contact is in electrical communication with the ground, and
   wherein the third resistor is configured such that a second gate end of the third resistor is connected to the second gate contact.

8. The ESD protection circuit of claim 7,
   wherein the ESD protection circuit is configured to turn ON when a voltage at the input node is equal to or greater than a positive trigger voltage, and is configured to turn ON when the voltage at the input node is less than or equal to a negative trigger voltage,
   wherein the first and second and third transistors are pHEMTs (pseudomorphic high electron mobility transistors),
   wherein the first, second, and third transistors are enhanced mode transistors,
   wherein the first, second, and third transistors are configured to provide the positive trigger voltage based on the following equation: positive trigger voltage equals a drain-gate breakdown voltage of the first transistor plus the threshold voltage of the first transistor, and
   wherein the first, second, and third transistors are substantially identical.

* * * * *